United States Patent
Mizuno et al.

(10) Patent No.: US 7,750,484 B2
(45) Date of Patent: Jul. 6, 2010

(54) SEMICONDUCTOR DEVICE WITH FLIP-CHIP CONNECTION THAT USES GALLIUM OR INDIUM AS BONDING MATERIAL

(75) Inventors: Shigeru Mizuno, Nagano (JP); Takashi Kurihara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/146,003

(22) Filed: Jun. 25, 2008

(65) Prior Publication Data

US 2009/0001571 A1 Jan. 1, 2009

(30) Foreign Application Priority Data

Jun. 26, 2007 (JP) ............... 2007-167428

(51) Int. Cl.
*H01L 23/498* (2006.01)
(52) U.S. Cl. ............... 257/778; 257/781; 257/E23.028
(58) Field of Classification Search ........... 257/E23.028
See application file for complete search history.

(56) References Cited

U.S. PATENT DOCUMENTS 5,611,481 A * 3/1997 Akamatsu et al. ...... 228/180.22
2003/0215981 A1* 11/2003 Strouse et al. ............. 438/118
2008/0305581 A1* 12/2008 Skeete ..................... 438/118

FOREIGN PATENT DOCUMENTS

| JP | 8-31835 | 2/1996 |
| JP | 2003-7902 | 1/2003 |
| JP | 2007-27526 | 2/2007 |

* cited by examiner

*Primary Examiner*—Stephen W Smoot
(74) *Attorney, Agent, or Firm*—Rankin, Hill & Clark LLP

(57) ABSTRACT

A method of manufacturing a semiconductor device in which a semiconductor element 10 is mounted on a substrate 20 through a flip-chip connection, includes the steps of cladding gallium as a bonding material 30 to a connecting pad 22 formed on a surface of the substrate 20, diffusing copper from the connecting pad 22 formed of the copper into the bonding material 30 through heating under vacuum, thereby bringing a state of a solid solution of the gallium and the copper, and aligning a connecting bump 12 formed on the semiconductor element 10 with the connecting pad 22 and bonding the connecting bump 12 to the connecting pad 22 through the bonding material 30 in a state of a solid solution under heating.

5 Claims, 6 Drawing Sheets

SEMICONDUCTOR DEVICE WITH FLIP-CHIP CONNECTION THAT USES GALLIUM OR INDIUM AS BONDING MATERIAL

BACKGROUND OF THE INVENTION

The present invention relates to a semiconductor device and a method of manufacturing the semiconductor device, and more particularly to a semiconductor device mounting a semiconductor element through a flip-chip connection and a method of manufacturing the semiconductor device mounting the semiconductor element through the flip-chip connection.

With an increase in an integration of a semiconductor element and a reduction in a size of a semiconductor device, there has often been used a method of mounting the semiconductor element through a flip-chip connection. As a method of mounting a semiconductor element onto a substrate through a flip-chip connection, a semiconductor element including a gold bump as a connecting bump is soldered and mounted onto a connecting pad formed on a substrate (for example, see Patent Documents 1 and 2).

The method of mounting a semiconductor element on a substrate by using a gold bump includes a method of sticking solder powder to a connecting pad formed on a substrate and aligning the connecting pad with a gold bump, and carrying out heating to a temperature at which the solder powder is molten, thereby performing solder bonding (Patent Document 3) and a method of previously supplying an underfill resin to a substrate, applying an ultrasonic vibration to a semiconductor element with a gold bump aligned with a connecting pad, and pressing them to bond the gold bump to the connecting pad.

[Patent Document 1] JP-A-8-31835

[Patent Document 2] JP-A-2007-27526

[Patent Document 3] JP-A-2003-7902

The method of sticking the solder powder to the connecting pad and bonding the gold bump to the connecting pad through the solder bonding is used for manufacturing a semiconductor device in which the connecting pad is disposed at a very small pitch of 50 to 60 μm. At the solder bonding step, lead free solders such as Sn-3.5Ag (a melting point of 221° C.) and Sn-3Ag-0.5Cu (a melting point of 217 to 220° C.) have been used to reduce a load for an environment. The lead free solders have higher melting points than those of lead based solders and are used under heating at a high temperature of approximately 250° C. which is higher than the melting points by approximately 30° C.

There is a problem in that the semiconductor device is wholly deformed to be warped depending on a difference between a coefficient of thermal expansion (2.3 ppm/K) of the semiconductor element and a coefficient of thermal expansion (20 to 60 ppm/K) of a substrate formed by an organic substrate when the semiconductor element is thus bonded to the substrate at a high temperature and the temperature is dropped to a room temperature.

FIG. 6 explanatorily shows a state in which temperatures of a semiconductor element 10 and a substrate 20 are dropped to a room temperature after the solder bonding. A gold bump 12 formed on an electrode of the semiconductor element 10 is bonded to a connecting pad 22 formed on the substrate 20 through a solder 14. The substrate 20 has a higher coefficient of thermal expansion than that of the semiconductor element 10. When the temperature is dropped to the room temperature, therefore, the substrate 20 contracts more greatly than the semiconductor element 10 and a force for breaking a bonded portion acts between the gold bump 12 and the connecting pad 22.

When the semiconductor element is mounted through a flip-chip connection, an underfill resin is filled between the semiconductor element and the substrate in order to firmly hold the bonded portion of the semiconductor element and the substrate through the underfill resin and to protect the bonded portion of the gold bump and the connecting pad so as not to be peeled. It is effective that the underfilling is carried out before a drop in the temperature after the solder bonding. However, a void is apt to be generated in the underfill resin when the underfilling is carried out at a high temperature, and the function of the underfilling is greatly deteriorated when the void is generated.

When an arranging pitch of the connecting pad is reduced to be 50 to 60 μm, moreover, a width of the connecting pad is necessarily reduced. For this reason, there is also a problem in that a bonding area of the gold bump and the connecting pad is reduced and a bonding strength is thus reduced, and the bonded portion is apt to be broken by an external force applied from a thermal stress.

If the semiconductor element is mounted in a state in which a stress acts between the gold bump and the connecting pad, moreover, there is also a problem in that an abnormal diffusion is generated in the bonded portion and a whisker is thus formed, resulting in an incomplete electrical connection of the bonded portion with the passage of time after the mounting.

SUMMARY OF THE INVENTION

The invention is made to solve the problems and has an object to provide a semiconductor device and a method of manufacturing the semiconductor device which can drop a bonding temperature when flip-chip connecting a semiconductor element to a substrate, thereby reducing a thermal stress acting between the semiconductor element and the substrate in a drop from the bonding temperature to a room temperature and enhancing a bonding reliability of the semiconductor element and the substrate.

In order to achieve the object, the invention has the following structure.

According to a first aspect of the invention, there is provided a semiconductor device including:

a substrate;

a semiconductor element on the substrate through a flip-chip connection;

a connecting bump formed on the semiconductor element; and a connecting pad provided on the substrate, wherein the connecting bump and the connecting pad are bonded to each other by using either gallium (Ga) or indium (In) in a state of a solid solution as a bonding material.

Further, according to a second aspect of the invention, there is provided a method of manufacturing a semiconductor device in which a semiconductor element is mounted on a substrate through a flip-chip connection, including the steps of:

cladding gallium in a state of a solid solution as a bonding material to a connecting pad formed on a surface of the substrate; and aligning a connecting bump formed on the semiconductor element with the connecting pad, and bonding the connecting bump to the connecting pad through the bonding material in a state of a solid solution under heating.

The step of cladding the gallium to the connecting pad in the state of the solid solution implies that a dissimilar metal is mixed into the gallium and the gallium is cladded to the connecting pad in the state of the solid solution. For a method of cladding the gallium in the state of the solid solution, it is possible to utilize a sputtering method or a plating method.

Further, according to a third aspect of the invention, there is provided the method of manufacturing a semiconductor device according to the second aspect, wherein the step of cladding gallium in a state of a solid solution as a bonding material to the connecting pad includes:

a step of cladding the gallium as the bonding material to the connecting pad formed on the surface of the substrate, and a step of diffusing copper from the connecting pad formed of the copper into the bonding material through heating under vacuum, and bringing the gallium into a state of a solid solution with the copper.

By the heating under vacuum, it is possible to diffuse the copper from the connecting pad into the gallium and to easily bring the gallium into the state of the solid solution.

Further, according to a fourth aspect of the invention, there is provided the method of manufacturing a semiconductor device according to the third aspect, wherein a heating temperature at the step of bonding the connecting bump to the connecting pad is set to be equal to or lower than a heating temperature in the step of bringing the gallium into a state of a solid solution through the heating under vacuum.

Consequently, it is possible to reliably bond the bump to the connecting pad without excessively melting the gallium.

Further, according to a fifth aspect of the invention, there is provided the method of manufacturing a semiconductor device according to the third aspect, wherein a heating temperature at which an underfill resin is filled and thermally cured is set to be lower than a heating temperature at the step of bringing the gallium into a state of a solid solution through the heating under vacuum.

Further, according to a sixth aspect of the invention, there is provided the method of manufacturing a semiconductor device according to any one of the second to fifth aspects, wherein the semiconductor element includes a gold bump as the connecting bump, and the gold bump and the connecting pad are bonded to each other through the gallium to be the bonding material in a state of a solid solution.

Further, according to a seventh aspect of the invention, there is provided the method of manufacturing a semiconductor device according to any one of the second to sixth aspects, further including:

an underfilling step of filling an underfill resin in a bonded portion of the semiconductor element and the substrate, and thermally curing the underfill resin after the step of bonding the connecting bump to the bonding material.

Further, according to an eighth aspect of the invention, there is provided the method of manufacturing a semiconductor device according to any one of the second to sixth aspects, further including:

a step of supplying an underfill resin to the substrate after the step of bringing the gallium into a state of a solid solution through the heating under vacuum, and a step of bonding the connecting bump to the bonding material in a state of a solid solution, and thermally curing the underfill resin in heating.

According to the semiconductor device and the method of manufacturing a semiconductor device in accordance with the invention, the semiconductor element is mounted by using the gallium or the indium as the bonding material. Consequently, it is possible to flip-chip connect the semiconductor element at a lower temperature than that in the case in which a conventional lead free solder is used, to relax a thermal stress generated between the semiconductor element and the substrate, thereby enhancing a bonding reliability of the bonded portion of the semiconductor element and the substrate. In addition, the flip-chip connection can be carried out at a lower temperature than that in the conventional art. Therefore, it is possible to carry out the underfilling without generating a void in the resin.

DETAILED DESCRIPTION OF THE PREFERRED EMBODIMENTS

A preferred embodiment according to the invention will be described below in detail with reference to the accompanying drawings.

(Process for Manufacturing Semiconductor Device)

FIG. 1 shows a process for mounting a semiconductor element 10 having a metal bump 12 on a substrate 20 through a flip-chip connection by a method of manufacturing a semiconductor device according to the invention.

Figure 1A:
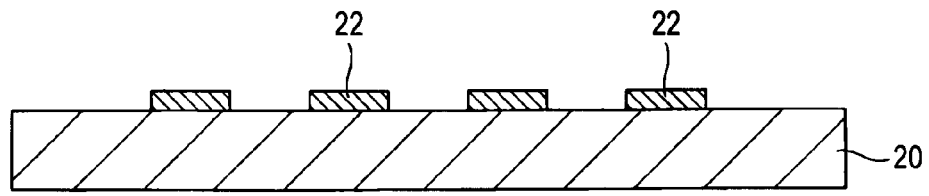
FIGS. 1A to 1E are views for explaining an example of a process for manufacturing a semiconductor device according to the invention.

FIG. 1A shows a state in which a connecting pad 22 is formed on the substrate 20 on which the semiconductor element 10 is to be mounted. The connecting pad 22 is electrically connected to a wiring pattern formed on the substrate 20, and is aligned with a planar arrangement of the gold bump 12 formed on the semiconductor element 10 and is thus arranged. A printed circuit board or a build-up substrate is used for the substrate 20 including the connecting pad 22. A material of the substrate 20 and a method of forming the wiring pattern and the connecting pad on the substrate 20 are not particularly restricted.

In the invention, gallium (Ga) to be a low melting metal is used as a bonding material for bonding the gold bump 12 to the connecting pad 22.

Figure 1B:
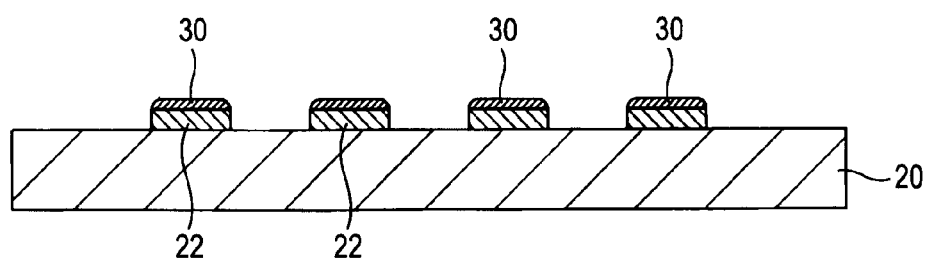

FIG. 1B shows a state in which a bonding material 30 formed of gallium is cladded to the connecting pad 22 formed on the substrate 20. The gallium is a metal having a melting point of 29.8° C. and is a liquid at a room temperature (or in a slightly heating state). Therefore, liquid gallium can be supplied to the connecting pad 22 through a coating method (a dispensing method). The gallium is supplied in a proper amount depending on an area of the connecting pad 22 and a size of the gold bump. In the embodiment, the gallium is supplied in a thickness of approximately 5 μm.

As a method of supplying the gallium to the connecting pad 22, it is possible to utilize a method of dipping a workpiece into the liquid gallium (a dipping method), a method of depositing gallium on the connecting pad 22 in a vacuum chamber (a vacuum depositing method), and a method of supplying the gallium through plating in addition to the dispensing method. In the case in which the dipping method, the vacuum depositing method or the plating method is used, it is preferable to expose a portion having the connecting pad 22 formed thereon from a surface of the substrate (the workpiece) 20 and to coat the same portion with a protecting film such as a resist, and to clad the gallium to the connecting pad 22 and to then remove the protecting film.

Figure 1C:
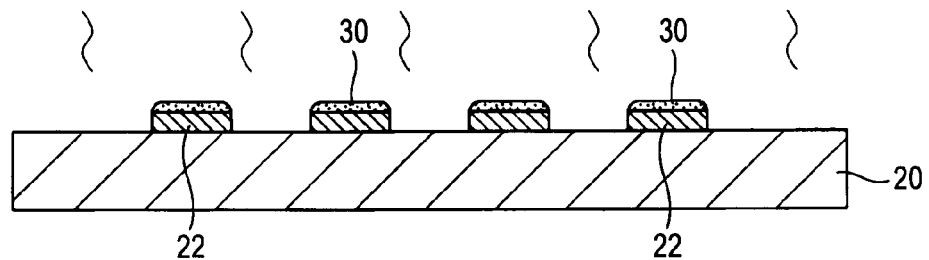

FIG. 1C shows a characteristic step in a process for manufacturing a semiconductor device according to the invention which serves to heat (vacuum heat) a workpiece in a vacuum chamber. The vacuum heating step is intended for diffusing copper from the connecting pad 22 formed of copper into the liquid gallium cladded to the surface of the connecting pad 22, thereby changing the gallium to be a solid solution with the copper.

In the embodiment, the workpiece is heated under vacuum at 200° C. A state of the gallium supplied to the connecting pad 22 is observed while the workpiece is heated under vacuum. Consequently, it is observed that the surface of the gallium which is a liquid at first began to be solidified and is changed into the solid solution.

Figure 4:
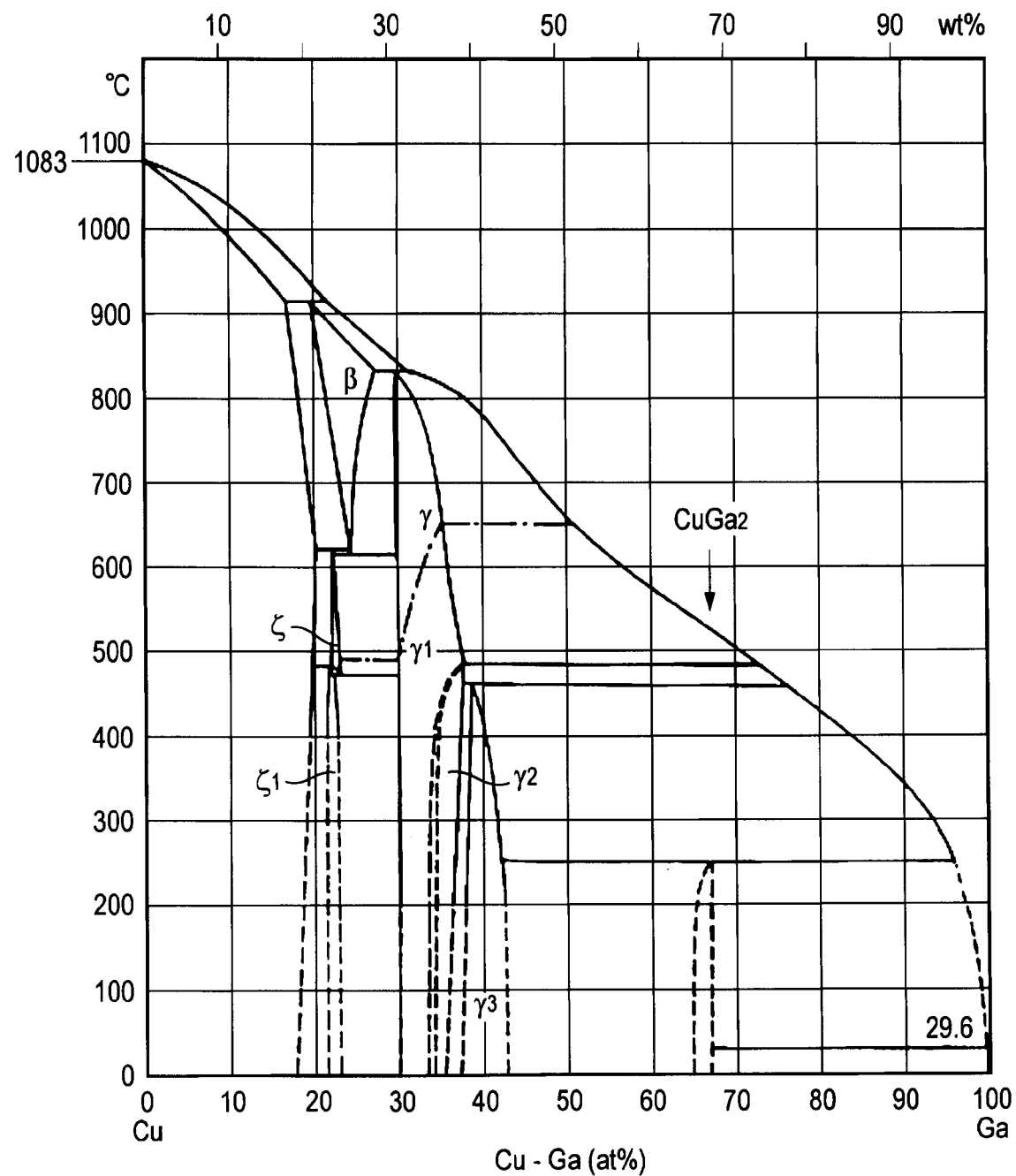
FIG. 4 is a state chart for copper and gallium.

FIG. 4 is a state chart for the copper and the gallium. The state chart shows that the gallium is changed into a solid solution (in a state in which a solid and a liquid are mixed) at 29.6° C. or higher when it has a concentration of 67 at % to 100 at %. If there is any portion in which the concentration of the gallium is equal to or higher than 67 at %, accordingly, a portion molten at a temperature of 29.6° C. or higher coexists, which is not preferable in respect of a reliability of a product.

When heating is carried out at 200° C. as in the embodiment, the copper is diffused, and a surface concentration of the gallium is reduced to be 97% or less in approximately five minutes if the gallium has a thickness of 5 μm. In the step of carrying out the vacuum heating at 200° C., the gallium cladded to the connecting pad 22 has the highest concentration of approximately 97% in any portion. Thus, it can be supposed that the gallium is changed from a liquid phase to a solid solution. Although the heating under vacuum is carried out at 200° C. in the embodiment, it is possible to properly select a heating temperature and a time required for heating at the vacuum heating step.

Figure 1D:
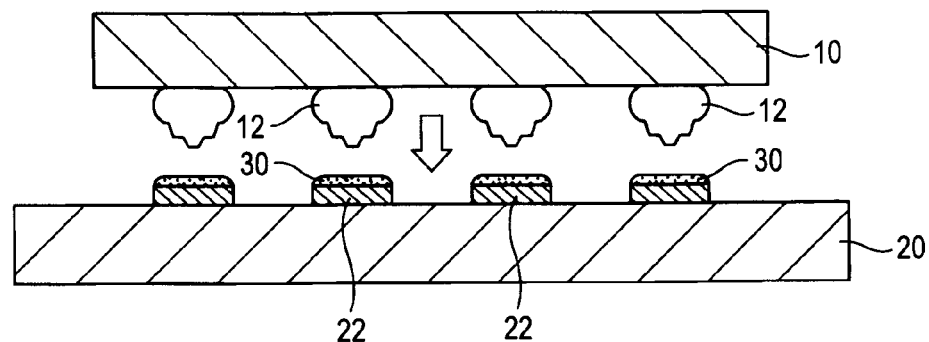

FIG. 1D shows a step of heating the workpiece under vacuum and then aligning the semiconductor device 10 with the substrate 20, thereby flip-chip connecting them. The gold and the gallium have such properties that they are apt to be diffused mutually and strongly. Under the heating, the gold bump 12 and the connecting pad 22 to which the bonding material 30 formed of the gallium is cladded are bonded to each other through pressure welding.

Figure 5:
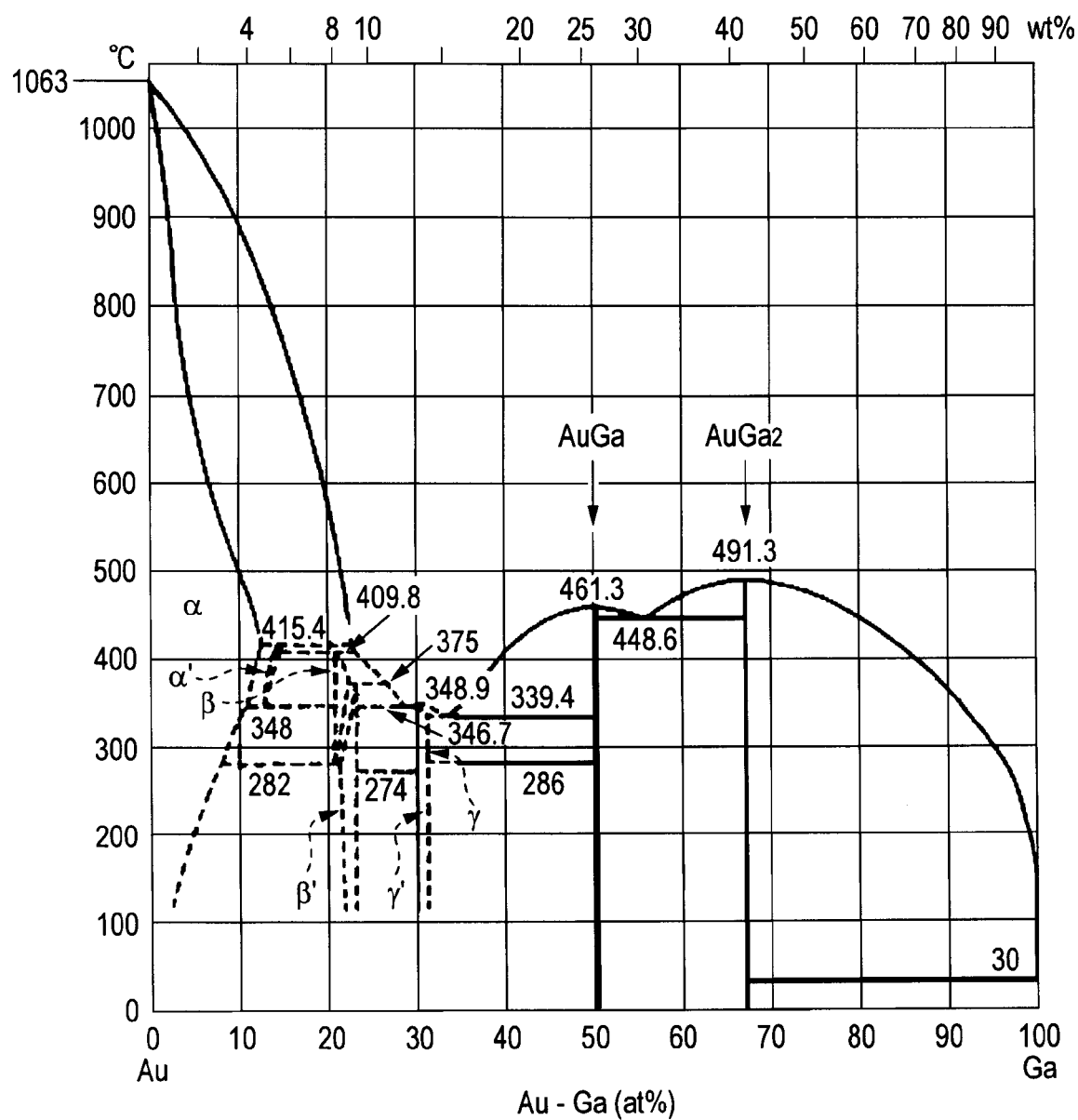
FIG. 5 is a state chart for gold and gallium.
Figure 6:
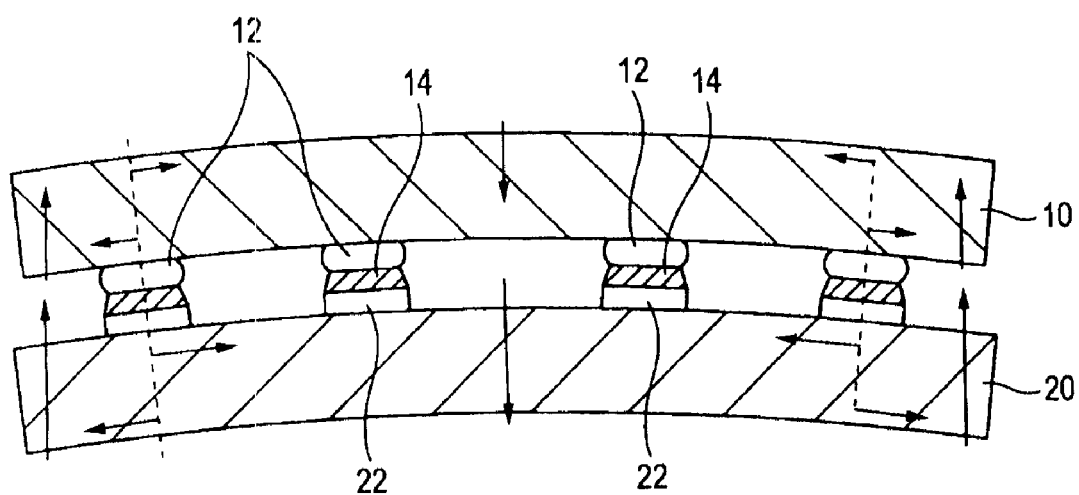
FIG. 6 is a sectional view showing a structure of a conventional semiconductor device.

FIG. 5 is a state chart for the gold and the gallium. The state chart shows that the gallium is changed into a solid solution (in a state in which a liquid and a solid are mixed) in a concentration of 67 at % to 100 at %. When the liquid gallium and the gold are caused to come in contact with each other at 70° C., a mutual diffusion is generated heavily. In order to bond the gold bump 12 to the connecting pad 22 in a state of a solid phase, accordingly, it is effective to diffuse the copper into the gallium through the heating under vacuum, and to bring the gallium into the state of the solid solution and to then carry out the bonding.

Figure 1E:
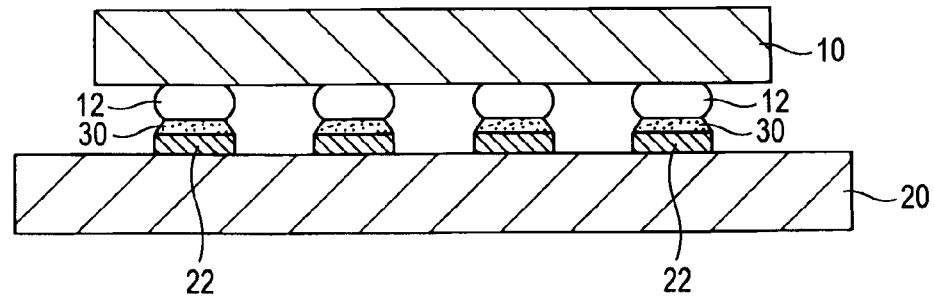

In the embodiment, the workpiece is heated to 150° C. to flip-chip connect the gold bump 12 to the connecting pad 22 through the gallium. FIG. 1E shows a state in which the semiconductor element 10 is flip-chip connected to the substrate 20. The bonding material 30 formed of the gallium is diffused to the vicinity of a boundary between a ball portion and a step portion in the gold bump 12 and is reliably bonded thereto.

It is preferable that the flip-chip connection should be carried out under heating at an equal temperature to a vacuum heating temperature or a lower temperature than the vacuum heating temperature. The flip-chip connecting temperature is set to be as low as possible in order to reduce a thermal stress generated between the semiconductor element 10 and the substrate 20 and to prevent the gallium from being excessively molten in the flip-chip connection.

Figure 2:
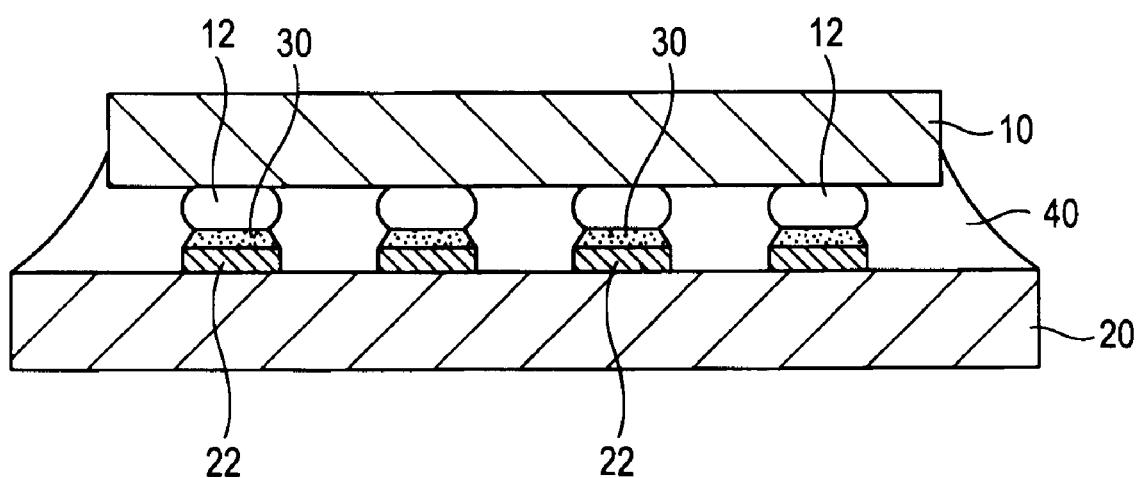
FIG. 2 is a sectional view showing a structure according to an embodiment of the semiconductor device in accordance with the invention.

After the semiconductor element 10 is flip-chip connected to the substrate 20, an underfill resin 40 is filled in a bonded region interposed between the semiconductor element 10 and the substrate 20 and is cured so that a semiconductor device having the semiconductor element 10 flip-chip connected is obtained (FIG. 2).

In the embodiment, the underfilling step is progressed with an environmental temperature maintained to be the heating temperature of 150° C. at which the semiconductor element 10 is flip-chip connected to the substrate 20, and the underfill resin 40 is thus cured thermally. By dropping the temperature to the room temperature after curing the underfill resin 40, it is possible to enhance a bonding reliability of the bonded portion of the semiconductor element 10 and the substrate 20.

The heating temperature at which the semiconductor element 10 is flip-chip connected to the substrate 20 can also be set to be approximately 200° C., that is, to be almost equal to the vacuum heating temperature. The reason is as follows. A time required for the flip-chip connection is approximately 5 to 10 seconds, and the solid solution of the gallium and the copper is solidified in a short time through a drop in the temperature even if the same solid solution is molten, for example. Consequently, it is possible to avoid the generation of an electrical short circuit between the adjacent connecting pads. On the other hand, when the underfill resin 40 is to be thermally cured, a time of 1 to 2 hours is required. For this reason, the gallium is apt to be moved if the temperature at which the underfill resin 40 is to be thermally cured is excessively raised, and the electrical short circuit is thus generated easily between the adjacent connecting pads. Accordingly, the temperature at which the underfill resin is to be thermally cured is preferably set to be lower than the heating temperature at which the gallium is brought into the state of the solid solution.

In the process for manufacturing a semiconductor device according to the embodiment, the heating temperature in the flip-chip connection of the semiconductor element 10 to the substrate 20 is set to be 150° C. A bonding temperature of the gold and the gallium can also be set to be approximately 100° C. In case of the method according to the invention, the flip-chip connection can be carried out at a considerably lower temperature than a conventional flip-chip connecting temperature. As a result, when the temperature in the heating environment of the flip-chip connection is dropped to the room temperature, the thermal stress generated between the semiconductor element 10 and the substrate 20 depending on a difference in a coefficient of thermal expansion therebetween can be relaxed more effectively than that in the conventional art. Thus, it is possible to reduce a breaking force and a peeling force which act on the bonded portion and to enhance a reliability of the semiconductor device, particularly, a bonding reliability between the electrode and the connecting pad in the semiconductor element.

Moreover, the underfilling can also be carried out at a comparatively low temperature. Thus, it is possible to carry out suitable underfilling without generating a void in the underfill resin.

While the description has been given to the bonding properties of the gold bump and the gallium in the embodiment, it is also possible to apply the invention to a semiconductor element including a bump formed of a metal other than the gold bump, for example, a copper bump in addition to the gold bump in the same manner. Also in this case, the gallium is used as a bonding material so that the gallium is diffused into the copper bump and the bump and the connecting pad are bonded to each other.

(Underfilling Method)

The method of manufacturing a semiconductor device according to the invention is not restricted to the manufacturing method described above but can also be executed by other manufacturing processes. More specifically, although the semiconductor element 10 is flip-chip connected to the substrate 20 and the underfilling is then carried out in the embodiment, it is also possible to employ a method of previously supplying the underfill resin to the substrate 20 and then flip-chip connecting the semiconductor element 10.

In the case in which the underfill resin 40 is previously supplied to the substrate 20 and the flip-chip connection is then carried out, the gallium is supplied as the bonding material 30 to the connecting pad 22 and the copper is then diffused into the gallium through heating under vacuum, and a state in which the surface of the gallium is started to be solidified is brought to then supply the underfill resin 40. A resin material which is nonreactive to the gallium is used for the underfill resin 40. The underfill resin 40 is supplied to the substrate 20 and the gold bump 12 is then aligned with the connecting pad 22, and the semiconductor element 10 is pressure welded to the substrate 20 in a heating environment so that the gold bump 12 and the connecting pad 22 are bonded to each other through the gallium.

In the method of previously supplying the underfill resin 40 to the substrate 20 to carry out the flip-chip connection, the bonding properties of the connecting pad and the gold bump become a problem. In case of the method according to the embodiment, the gold bump and the gallium have such a great property that they can easily be diffused mutually. Also in the method of previously supplying the underfill resin 40, therefore, there is an advantage that the connecting pad 22 and the gold bump 12 are reliably bonded to each other. As compared with the case in which the conventional Sn—Ag bonding material is used, moreover, the flip-chip connection can be carried out at a lower temperature. Therefore, there is an advantage that it is possible to produce an effect for reducing the thermal stress generated between the semiconductor element 10 and the substrate 20 in the same manner.

(Low Melting Metallic Material to be Used as Bonding Material)

As described above, the gallium acts as a liquid phase in the vicinity of the room temperature and the gallium to be the liquid phase and the gold bump are mutually diffused heavily. Therefore, the gallium is used as the bonding material through a phase change into the state of the solid solution. In the vacuum heating method, the copper in the connecting pad 22 is diffused into the gallium so that the gallium is changed from the liquid phase into the solid solution. It is possible to change the gallium into the solid solution by diffusing a dissimilar metal, for example, In, Bi, Sb or Zn into the gallium. In this case, when the bonding material 30 formed of the gallium is to be bonded to the connecting pad 22 formed on the substrate 20 (the step shown in FIG. 1B), it is preferable to carry out cladding in a state in which the dissimilar metal is mixed at approximately several % into the gallium. A method of mixing the dissimilar metal into the gallium and sticking them includes a method of carrying out a formation through sputtering by using a target in which the dissimilar metal is mixed into the gallium and a method of carrying out plating to bring a state in which the gallium and the dissimilar metal are mixed in a plated film.

For a method of suppressing the diffusion of the gallium into the gold bump and enhancing a bonding reliability after bonding the gold bump to the connecting pad through the gallium, moreover, a method of mixing silver (Ag) into the gallium is effective.

Figure 3A:
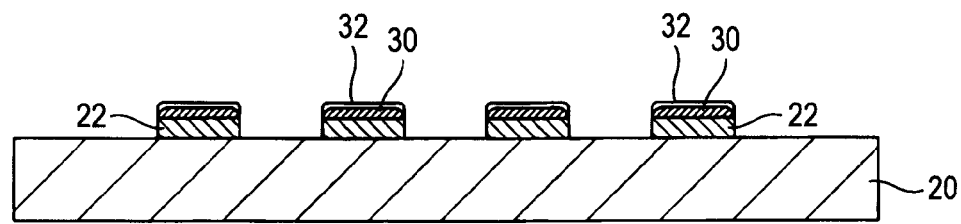
FIGS. 3A to 3C are views for explaining another example of the process for manufacturing a semiconductor device.

FIG. 3A shows a state in which the bonding material 30 formed of gallium is stuck to the connecting pad 22 formed on the surface of the substrate 20, and furthermore, a silver layer 32 is formed on the surface of the bonding material 30. It is preferable to form the silver layer 32 to have a smaller thickness (several hundreds angstroms) than a thickness (approximately 5 μm) of the bonding material 30 formed of the gallium. The silver layer 32 can be formed by sputtering or plating.

Figure 3B:
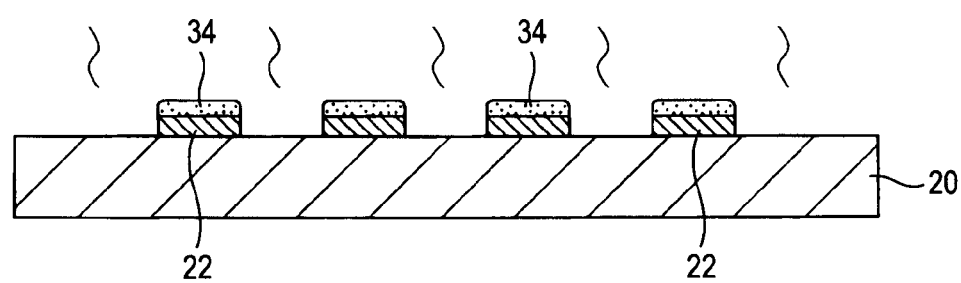

FIG. 3B shows a state in which Ag is diffused from the silver layer 32 into the bonding material 30 formed of the gallium through a vacuum heat treatment, and at the same time, Cu is diffused from the connecting pad 22 into the gallium to form a bonding material layer 34 on the surface of the connecting pad 22. The bonding material layer 34 to be cladded to the surface of the connecting pad 22 through the vacuum heat treatment is a solid solution, and the bonding material layer 34 is brought into a state in which the copper (Cu) and the silver (Ag) are diffused into the gallium to be a principal component.

Figure 3C:
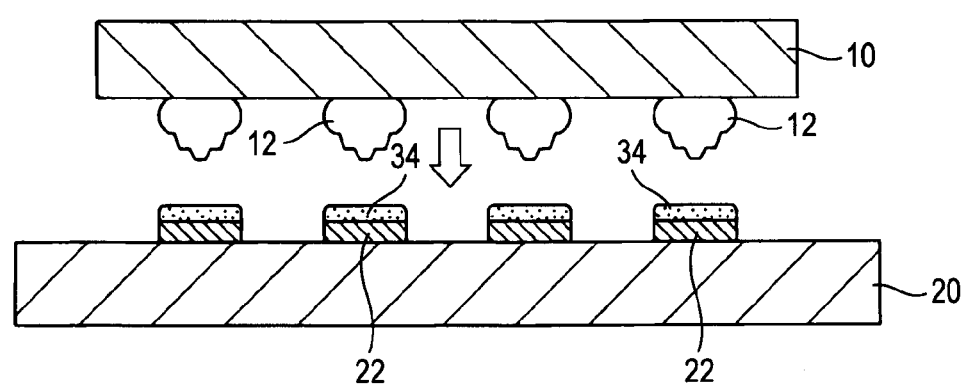

FIG. 3C shows a state in which the semiconductor element 10 is flip-chip connected to the substrate 20 through the bonding material layer 34. The gold bump 12 formed on the semiconductor element 10 is aligned with the connecting pad 22 and the gold bump 12 and the bonding material layer 34 in the state of the solid solution are heated to a temperature at which they are mutually diffused and bonded. Thus, the gold bump 12 and the connecting pad 22 are bonded to each other through the bonding material layer 34.

In the method of manufacturing a semiconductor device according to the embodiment, the silver is contained in the bonding material. When the gold bump 12 and the connecting pad 22 are to be bonded to each other, therefore, it is possible to prevent the gold bump 12 and the gallium from being diffused excessively and mutually. Consequently, it is possible to precisely bond the gold bump 12 to the connecting pad 22. Moreover, the silver is contained in the bonded portion of the gold bump 12 and the connecting pad 22. Therefore, an abnormal diffusion in the bonded portion can be suppressed. Consequently, it is possible to enhance the bonding reliability of the gold bump 12 and the connecting pad 22.

Although the description has been given to the example in which the gallium is used as the bonding material for bonding the gold bump 12 to the connecting pad 22 in the embodiment, it is also possible to use a metal other than the gallium, for example, indium (In) as a low melting metallic material which can carry out the bonding at a lower temperature than the conventional Sn—Ag bonding material. By using the low melting metal to flip-chip connect the semiconductor element 10 to the substrate 20, it is possible to carry out the flip-chip connection at a lower temperature than that in the conventional art. Thus, it is possible to relax the thermal stress generated between the semiconductor element and the substrate, thereby enhancing the bonding reliability of the bonded portion of the semiconductor element and the substrate. Consequently, it is possible to suppress the generation of a problem in that an electrical short circuit is caused or a bonded portion is peeled when a semiconductor element having a density increased and having electrodes provided at a smaller pitch is mounted. Moreover, it is possible to enhance a reliability of a bonded portion when mounting a large-sized semiconductor element which is apt to be influenced by the thermal stress.

What is claimed is:

1. A semiconductor device comprising:
   a substrate;
   a semiconductor element mounted on the substrate through a flip-chip connection;
   a connecting bump formed on the semiconductor element; and
   a connecting pad provided on the substrate, wherein
   the connecting bump and the connecting pad are bonded to each other by a bonding material including silver (Ag) and one of gallium (Ga) and indium (In) in a state of a solid solution with at least a portion of the connecting bump and the connecting pad.

2. The semiconductor device according to claim 1, wherein the connecting bump and the connecting pad are both formed of a metal, and wherein metal from the connecting pad and metal from the connecting bump are diffused into the bonding material to form the solid solution that bonds the connecting pad to the connecting bump.

3. The semiconductor device according to claim 2, wherein the connecting bump is formed of gold (Au).

4. The semiconductor device according to claim 3, wherein the connecting pad is formed of copper (Cu).

5. The semiconductor device according to claim 2, wherein the connecting pad is formed of copper (Cu).

* * * * *